(12) United States Patent
Chen et al.

(10) Patent No.: US 6,809,425 B1
(45) Date of Patent: Oct. 26, 2004

(54) INTEGRATED CIRCUIT WITH A REPROGRAMMABLE NONVOLATILE SWITCH HAVING A DYNAMIC THRESHOLD VOLTAGE (VTH) FOR SELECTIVELY CONNECTING A SOURCE FOR A SIGNAL TO A CIRCUIT

(75) Inventors: Bomy Chen, Cupertino, CA (US); Isao Nojima, Los Altos, CA (US); Hung Q. Nguyen, Fremont, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 0 days.

(21) Appl. No.: 10/641,610

(22) Filed: Aug. 15, 2003

(51) Int. Cl.[7] ............................................. H01L 27/088
(52) U.S. Cl. ....................................... 257/901; 257/315
(58) Field of Search ................................. 257/901, 315

(56) References Cited

U.S. PATENT DOCUMENTS

| | | | |
|---|---|---|---|
| 5,029,130 A | 7/1991 | Yeh ............................. | 365/185 |
| 6,232,893 B1 * | 5/2001 | Cliff et al. ..................... | 341/78 |

\* cited by examiner

*Primary Examiner*—David Nelms
*Assistant Examiner*—Tu-Tu Ho
(74) *Attorney, Agent, or Firm*—Gray Cary Ware & Freidenrich LLP

(57) ABSTRACT

A nonvolatile reprogrammable switch for use in a PLD or FPGA has a nonvolatile memory cell connected to the gate of an MOS transistor, which is in a well, with the terminals of the MOS transistor connected to the source of the signal and to the circuit. The nonvolatile memory cell is of a split gate type having a first region and a second region, with a channel therebetween. The cell has a floating gate positioned over a first portion of the channel, which is adjacent to the first region and a control gate positioned over a second portion of the channel, which is adjacent to the second region. The second region is connected to the gate of the MOS transistor. The cell is programmed by injecting electrons from the channel onto the floating gate by hot electron injection mechanism. The cell is erased by Fowler-Nordheim tunneling of the electrons from the floating gate to the control gate. As a result, no high voltage is ever applied to the second region during program or erase. In addition, a MOS FET transistor has a terminal connected to the well, and another end to a voltage source, with the gate connected to the non-volatile memory cell. The switch also has a circuit element connecting the gate of the MOS transistor to a voltage source. The threshold voltage of the well can be dynamically changed by turning on/off the MOS FET transistor.

23 Claims, 4 Drawing Sheets

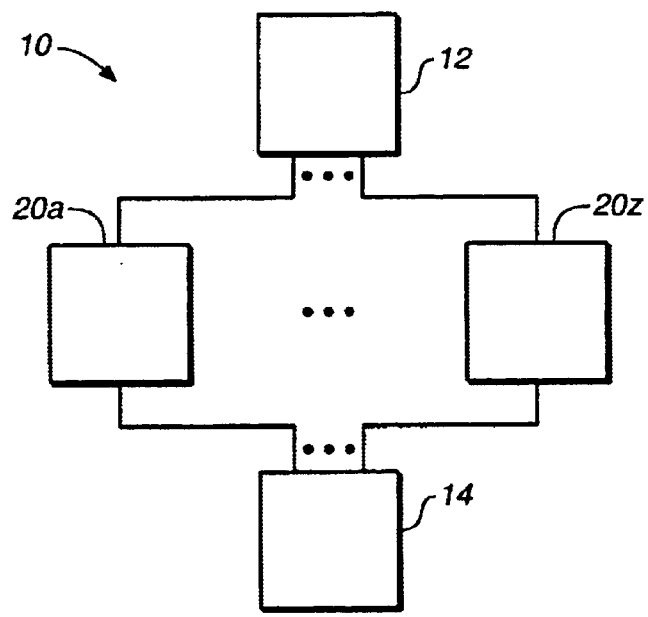
FIG._1
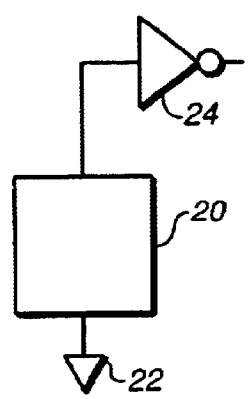
FIG._2a
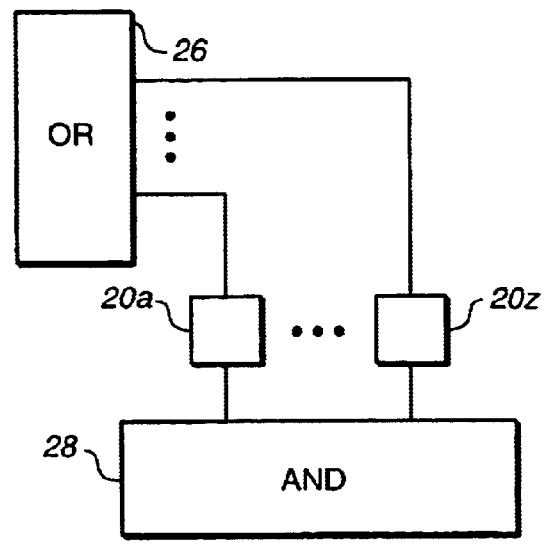
FIG._2b

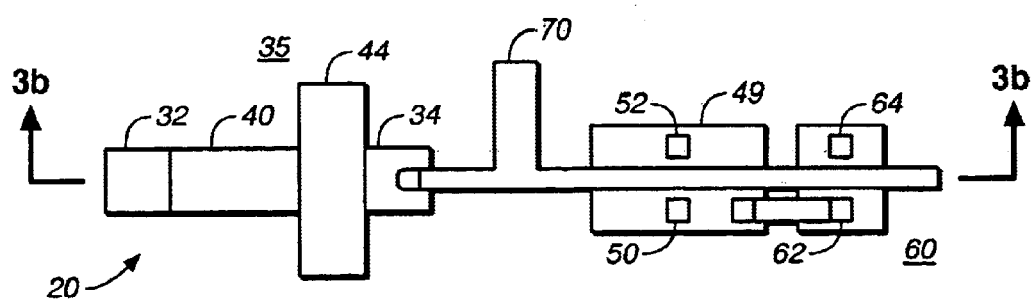
FIG._3a
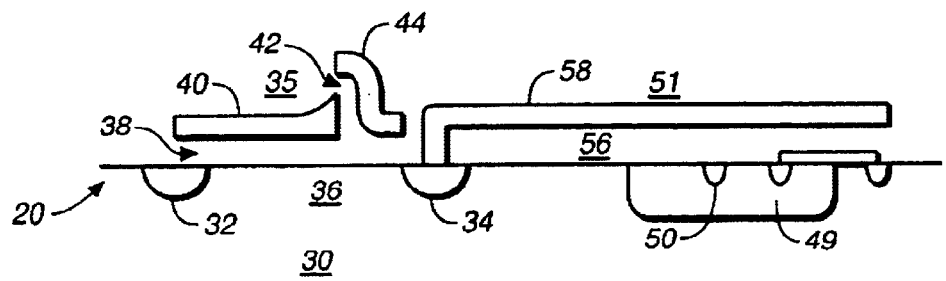
FIG._3b

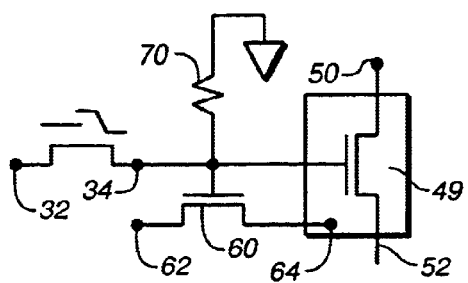
FIG._4a
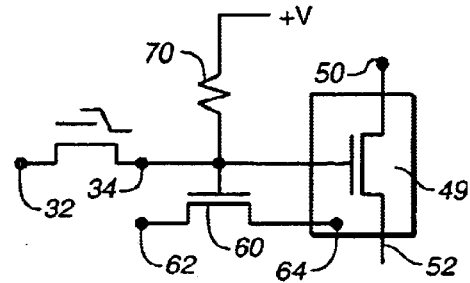
FIG._4b
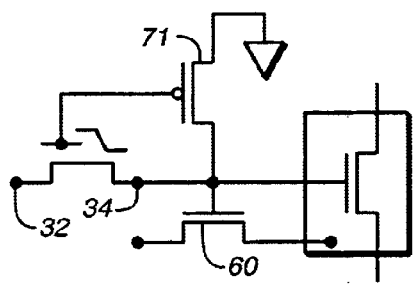
FIG._4c
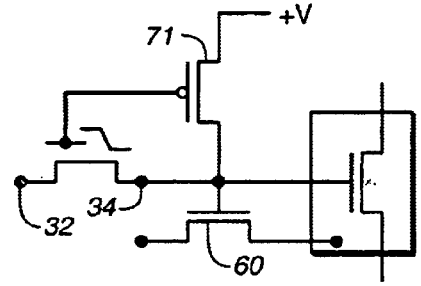
FIG._4d
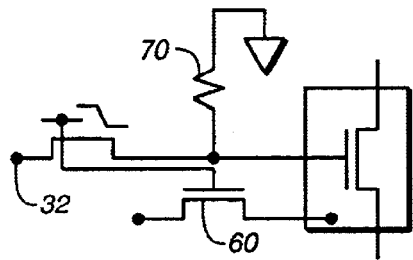
FIG._4e
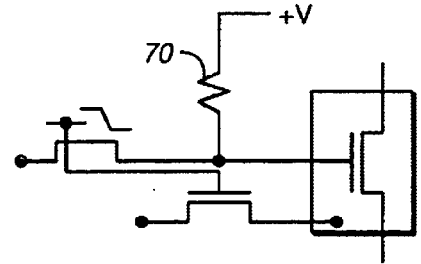
FIG._4f
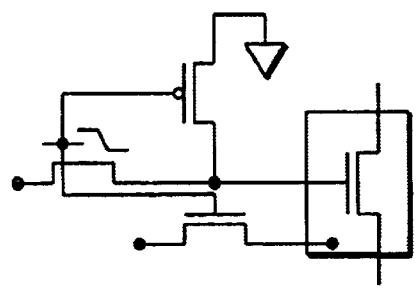
FIG._4g
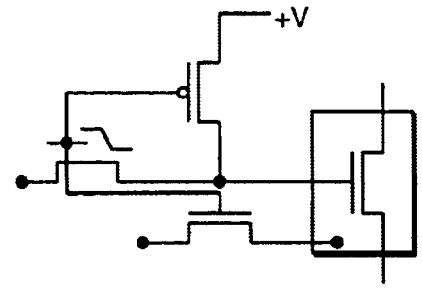
FIG._4h

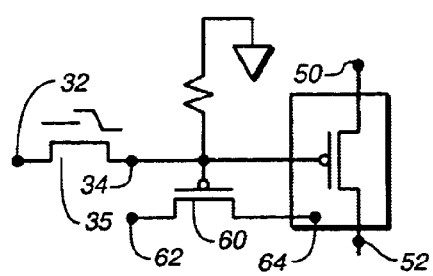
FIG._5a
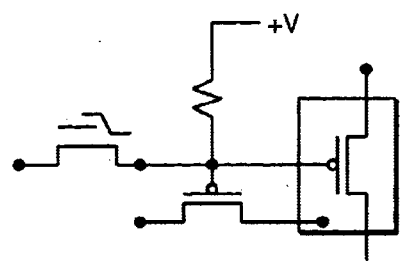
FIG._5b
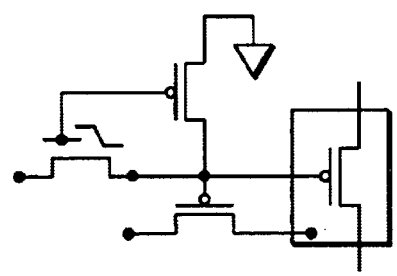
FIG._5c
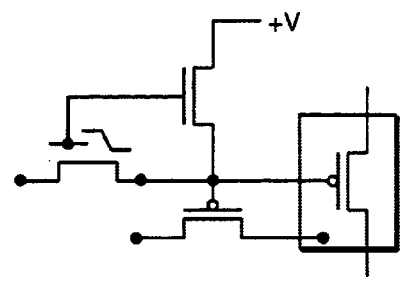
FIG._5d
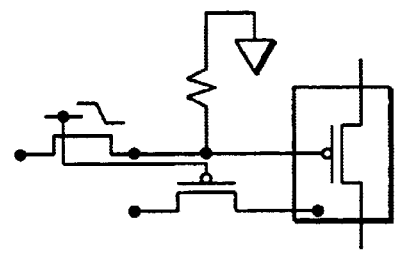
FIG._5e
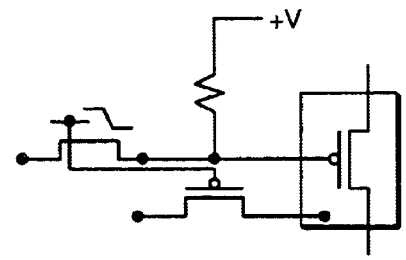
FIG._5f
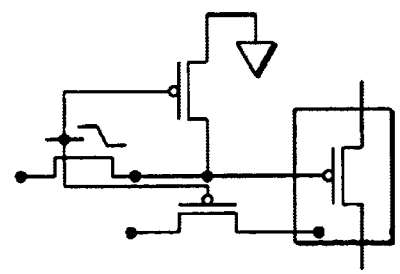
FIG._5g
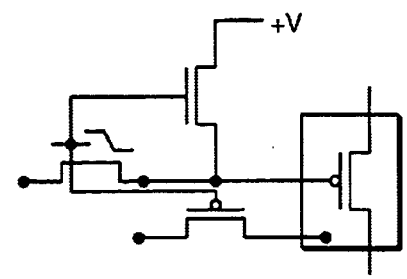
FIG._5h

INTEGRATED CIRCUIT WITH A REPROGRAMMABLE NONVOLATILE SWITCH HAVING A DYNAMIC THRESHOLD VOLTAGE (VTH) FOR SELECTIVELY CONNECTING A SOURCE FOR A SIGNAL TO A CIRCUIT

TECHNICAL FIELD

The present invention relates to an integrated circuit, such as a Programmable Logic Device (PLD) or a Field Programmable Gate Array (FPGA) where there is a source for a signal and a circuit and a nonvolatile reprogrammable switch with a dynamic threshold voltage ($V_{Th}$) for selectively connecting the source to the circuit.

BACKGROUND OF THE INVENTION

PLDs or FPGAs are well-known in the art. Each type of device comprises a source for generating a signal and a circuit with a switch, such as an FET transistor, for selectively connecting the source to the circuit. Thus, the integrated circuit comprising of a PLD or an FPGA can be "configured" to the user's needs. This configuration can be done "on the fly" in which the switch must be reconfigured every time the device is used. Alternatively, the configuration can be "permanent" such as through the use of fuses and the like and the selective connection is made "permanent." Finally, this connection can also be reprogrammable using a nonvolatile memory cell as the storage element for controlling the FET transistor.

Heretofore, a nonvolatile memory cell, such as a cell using a floating gate to store charges in a stack gate configuration or in a split gate configuration is well-known in the art. However, in a typical nonvolatile memory cell, that is based upon a floating gate for storing of charges and with the charges stored on the floating gate controlling the conduction of current flow in a channel, the nonvolatile memory cell has a first region, and a spaced apart second region with a channel therebetween. The floating gate is positioned over and spaced apart from a portion of the channel for controlling the conduction of the charges in the channel. Heretofore, with the exception of the nonvolatile memory cell disclosed in U.S. Pat. No. 5,029,130, which is assigned to the present assignee and whose disclosure is incorporated herein in its entirety by reference, all of the other prior art nonvolatile memory cells require the use of a high voltage applied to one of the first region or the second region for programming, and applied to the other of the first region or the second region for erase. As a result, because high voltage must be applied to both the first region and to the second region during the erase operation and the programming operation, a nonvolatile memory cell used as a part of a reprogrammable nonvolatile memory switch has required the use of another transistor to separate the non-volatile memory cell from the FET transistor. This addition of another transistor interposed between the nonvolatile memory cell and the FET transistor causes wastage in real estate in the silicon in that if a integrated circuit device has many interconnections requiring many reprogrammable nonvolatile memory switches, many excess transistors need to be used.

In U.S. Pat. No. 5,029,130, a nonvolatile memory cell is disclosed having a first region and a spaced apart second region with a channel therebetween. A floating gate is positioned over and spaced apart from a first portion of a channel which is adjacent to the first region. A control gate is positioned over and spaced apart from a second portion of the channel which is adjacent to the second region. In programming, the first region is supplied with a high positive voltage to attract electrons from the second region which are injected through the mechanism of hot electron injection onto the floating gate. During erase, the control gate is held at a "high" positive potential to attract electrons from the floating gate to Fowler-Nordheim tunnel through the insulation separating the control gate from the floating gate. The first and second regions can be held at ground or at floating.

SUMMARY OF THE INVENTION

An integrated circuit has a source for a signal and a circuit with a reprogrammable nonvolatile switch for selectively connecting the source for the signal to the circuit. The reprogrammable nonvolatile switch comprises a switching transistor in a well with a first terminal and a spaced apart second terminal and a channel in between the first terminal and the second terminal. A tunneling insulating layer is over the channel with a gate on the tunneling insulating layer and on the channel. The first terminal is connected to the source and the second terminal is connected to the circuit. A nonvolatile memory cell has a first region and a spaced apart second region with a channel therebetween. The first and second regions are of a first conductivity type with the channel being a second conductivity type. A first insulating layer is over the channel. A floating gate is on the first insulating layer and is spaced apart from a first portion of the channel. The first portion of the channel is adjacent to the first region. A control gate is on the first insulating layer and is spaced apart from a second portion of the channel. The second portion of the channel is adjacent to the second region. A second insulating layer is between the floating gate and the control gate. The gate of the switching transistor is connected to the second region of the cell. An FET transistor has a first terminal and a spaced apart second terminal with a channel therebetween. A gate controls the flow of current between the first terminal and the second terminal. The gate of the FET transistor is connected to the non-volatile memory cell. The first terminal is connected to a voltage source and the second terminal is connected to the well. A circuit element connects the second region of the cell to a second voltage. The first insulating layer permits the injection of charges from the channel onto the floating gate. The second insulating layer permits the Fowler-Nordheim tunneling of electrons between the floating gate and the control gate. The state of the non-volatile memory cell controls the voltage of the well.

BRIEF DESCRIPTION OF THE DRAWINGS

FIG. 1 is a block level diagram of an integrated circuit of the present invention showing a source for a signal and a circuit with a plurality of reprogrammable nonvolatile switches for selectively connecting the source to the circuit.

FIG. 2A is a circuit diagram of a detailed example of one use of the reprogrammable nonvolatile switch of the present invention for connecting a voltage source such as ground to a logic circuit, such as an inverter.

FIG. 2B is a detailed circuit diagram showing the use of the reprogrammable nonvolatile switch of the present invention for use in connecting a plane of OR gates to a plane of AND gates wherein the output of the OR gates is a plurality of logic signals with the array of AND gates selectively connected to the output signals from the array of OR gates.

FIG. 3A is a top view of one embodiment of the reprogrammable non-volatile switch of the present invention.

FIG. 3B is a cross-sectional view of the embodiment of the reprogrammable non-volatile switch shown in FIG. 3A.

FIGS. 4A–4H are circuit diagrams of various embodiments of the reprogrammable non-volatile switch of the present invention, in which the channel of the non-volatile memory cell is of a first conductivity type.

FIGS. 5A–5H are circuit diagrams of various embodiments of the reprogrammable non-volatile switch of the present invention, in which the channel of the non-volatile memory cell is of a second conductivity type.

DETAILED DESCRIPTION OF THE INVENTION

Referring to FIG. 1 there is shown a block level diagram of an integrated circuit 10 of the present invention. The integrated circuit 10 comprises a source 12 for a signal. As will be shown, as discussed hereinafter, the source 12 can be a voltage source such as ground or $V_{SS}$ or $V_{DD}$ or it can be a source of a logic signal or even an analog signal. As shown in FIG. 1, the source 12 generates a plurality of signals. The integrated circuit 10 also comprises a circuit 14. Again, as will be shown, the integrated circuit 14 can comprise any type of circuit element, such as logic circuit or analog circuit, to process each of the signals from the source 12. Finally, the integrated circuit 10 comprises a plurality of reprogrammable nonvolatile switches 20(a–z). Each reprogrammable nonvolatile switches 20(a–z) selectively connects one of the signals from the source 12 to the circuit 14.

Referring to FIG. 2A there is shown a circuit diagram of one example of the usage of the reprogrammable nonvolatile switch 20 of the present invention for use in an integrated circuit. The reprogrammable nonvolatile switch 20 connects ground voltage or $V_{SS}$ (it could also be $V_{DD}$ or any other voltage) to an inverter circuit 24. As can be seen, if the switch 20 connects the input of the inverter 24 to ground voltage 22, then the output of the inverter 24 is a high voltage. On the other hand, if the switch 20 were in an open position not connecting the input of the inverter 24 to ground 22, then the output of the inverter 24 is an indeterminate or floating signal.

Referring to FIG. 2B there is shown another example of the usage of the reprogrammable nonvolatile switch 20 of the present invention. In this case, the integrated circuit is a PLD which comprises of a plane of OR gates 26 which has a plurality of outputs, each of which is connected to the switch 20 and to the input of a plane of AND gates 28. If a switch 20 were open, then there is no connection between the output of the particular OR gate 26 to the input of the particular AND gate 28. However, if the switch 20 were closed, then the output of the particular OR gate 26 would connect to the input of the particular AND gate 28. Since there is an array of OR gates 26 and an array of AND gates 28, a plurality of switches 20(a–z) are shown.

Further, the switch 20 of the present invention can interconnect different circuits within an FPGA integrated circuit, or any other integrated circuit in which a signal from one portion of the integrated circuit can be selectively connected and reprogrammed to another portion of the circuit in the integrated circuit.

Referring to FIG. 3A there is shown a top view of one embodiment of the reprogrammable nonvolatile switch 20 of the present invention. The switch 20 is a part of an integrated circuit, similar to that shown and described in FIGS. 1, 2A and 2B. Thus, there is a substrate 30 of a semiconductive material, shown in FIG. 3b. However, as is well-known to those skilled in the art, the term "substrate" can also include a well within a substrate. Typically, the substrate 30 is a P type material, although it can also be N type. The switch 20 comprises a nonvolatile memory cell 35 of the type shown and described in U.S. Pat. No. 5,029,130, which as previously discussed, whose disclosure is incorporated herein by reference in its entirety. The cell 35 has a first region 32 separated from a second region 34, with a channel region 36 therebetween, all in the substrate 30. In the preferred embodiment, if the substrate is P type conductivity, then the first and second regions 32 and 34 are of N type and the channel 36 is also P-type. A first insulating layer 38 is over the channel 36. A floating gate 40 is on the first insulating layer 38 and is over a first portion of the channel 36. The first portion of the channel 36 is adjacent to the first region 32. A control gate 44 is on the first layer 38 and is over a second portion of the channel 36. The second portion of the channel 36 is adjacent to the second region 34. The control gate 44 is separated and spaced apart from the floating gate 40 by a second insulating layer 42. As disclosed in U.S. Pat. No. 5,029,130, the mechanism for programming, erasure and reading is as follows.

To program the cell 35, a positive high voltage such as +12 volts is applied to the first region 32. The second region 34 is held substantially at or near ground. The floating gate 40 is capacitively coupled to the first region 32. If +12 volts is applied to the first region 32, then the floating gate 40 would have approximately +8 volts thereon. A low voltage of approximately +2 volts is applied to the control gate 44, thereby turning on the second portion of the channel 36 beneath the control gate 44. As a result, electrons from the second region 34 are accelerated towards the first region 32. However, at a junction between the second portion of the channel 36 and the first portion of the channel 36, the electrons experience an increase in voltage attraction to the floating gate 40 and are injected through the hot electron injection mechanism onto the floating gate 40. Therefore, when the cell 35 is programmed, electrons are injected on the floating gate 40 and the presence of the electrons on the floating gate 40 affect the conduction of electrons in the channel 36. To erase the cell 35, a high potential such as +12 volts is applied to the control gate 44. The first and second regions 32 and 34 can be held at ground or floating. Electrons from the floating gate 40 are attracted by the high positive potential at the control gate 44 and through the mechanism of Fowler-Nordheim tunneling, they tunnel through the second insulating layer 42 separating the control gate 44 from the floating gate 40. To read the cell 35, a positive voltage such as $V_{DD}$ is placed at the first region 32 and $V_{SS}$ is at the second region 34, with a positive voltage placed on the control gate 44. If the floating gate 40 is erased, then it is positively charged and therefore the channel 36 between the first and second regions 32 and 34 would conduct. However, if the floating gate 40 is programmed, and since it is negatively charged, the first portion of the channel 36 would not conduct and there would not be any current flow between the first and second regions 32 and 34.

The reprogrammable nonvolatile switch 20 also comprises a switching transistor 51, such as an MOS transistor 51 in a well 49. As will be seen, the MOS transistor 51 can be P type or N type. The MOS transistor 51 comprises a first region 50 and a second region 52 with a channel 54 therebetween. The first region 50, the second region 52 and the channel 54 are in the well 49, which is in the substrate 30. Above the channel 54 is a tunneling insulating layer 56. Typically, the insulating layer 56 is approximately 20 angstroms thick or less. A gate 58, such as polysilicon, is positioned on the tunneling insulating layer 56 and is above the channel 54 and serves to control the conduction of charges between the first and second regions 50 and 52. Finally, the gate 58 of the MOS transistor 51 is connected to the second region 34 of the cell 35. The reprogrammable non-volatile switch 20 also comprises an FET transistor 60. The FET transistor 60 comprises a first region 62 and a second region 64 spaced apart therefrom. The FET transistor 60 also comprises a gate 58 which overlies the channel between the regions 62 and 64 and controls the conduction of current flow therebetween. The gate 58 is an extension of the gate 58 of the MOS transistor 51 and is also connected to the second region 34 of the memory cell 35. The second region 64 is connected to the well 49.

Finally, the reprogrammable non-volatile switch 20 also comprises a circuit element 70. In the embodiment shown in FIG. 3A and FIG. 3B, the circuit element 70 is a polysilicon resistor having two ends. One end of the polysilicon resistor is connected to the gate 58, which is connected to the second region 34 of the non-volatile memory cell. The other end of the polysilicon resistor 70 is connected to a voltage source.

One embodiment of the reprogrammable non-volatile switch 20 of the present invention is shown in FIG. 4A. In the embodiment shown in FIG. 4A, the first and second regions 32 and 34 of the non-volatile memory cell 35 are of N conductivity type. Similarly the first and second regions 50 and 52 of the MOS transistor 51 are also of N conductivity type. Finally, the first and second regions 62 and 64 of the FET transistor 60 are of N type. The second end 70 of the resistor 70 is connected to ground or VSS.

In the operation of the reprogrammable non-volatile switch 20 of the embodiment shown in FIG. 4A, to program the switch 20 the first and second regions 50 and 52 of the MOS transistor 51 are connected to ground. A positive voltage such as +12 volts is supplied to the first region 32 of the cell 35. A positive voltage such as +2 volts is supplied to the control gate 44. Electrons tunnel through the tunneling insulating layer 56 onto the gate 58 of the MOS transistor 51. Electrons then traverse to the second region 34 of the non-volatile memory cell 35. With the second region 34 at substantially ground, electrons from the second region 34 are accelerated to the first region 32 and through the mechanism of hot electron injection are injected onto the floating gate 40. An alternative mechanism to programming the cell 35 can occur by having the substrate 30 tied to ground during programming. In that event, electrons from the substrate 30 are tunneled through the tunneling insulating layer 56 onto the gate 58 of the MOS transistor 51. The electrons will then flow to the second region 34 and be programmed onto the floating gate 40 all as previously described. Finally, the cell 35 can be programmed by having electrons flow from the second end of the resistor 70, which is at ground or $V_{SS}$, to the second region 34, then accelerated to the floating gate 40. This can be accomplished if the resistance of the resistor 70 is low and/or the programming current is small.

The reprogrammable non-volatile switch 20 is erased by placing a high voltage such as +12 volts to the control gate 44 and with the first and second regions 32 and 34 either floating or tied to ground. Electrons from the floating gate 40 are attracted to the control gate 44 and through the mechanism of Fowler-Nordheim tunneling, they are removed from the floating gate 40 and the floating gate 40 becomes positively charged.

To operate the non-volatile switch 20, once it has been programmed or erased, an operating voltage such as +3.3 volts is supplied to the first region 32 of the cell 35. A positive voltage, such as +2 volts, is supplied to the control gate 44. If the floating gate 40 is erased, then the voltage +3.3 volts supplied to the first region 32 passes through the channel 36 onto the second region 34. Thus, +3.3 volts appears at the second region 34 where it is applied to the gate 58 of the NMOS transistor 51. Since the NMOS transistor 51 is an NMOS FET, the MOS transistor 51 is turned on by a positive voltage such as +3.3 volts. This then causes the signal from the source 12 to be supplied to the circuit 14. When the +3.3 volts appears at the second region 34, it is also supplied to the gate 58 of the NMOS FET transistor 60. This then turns on the NMOS transistor 60, thereby connecting the well 49 to a source of voltage which is supplied to the first region 62. However, if the floating gate 40 of the cell 35 is programmed, then the electrons on the floating gate 40 would inhibit the flow of current in the channel 36 between the first region 32 and the second region 34 of the cell 35. With the floating gate 40 being charged with electrons, the voltage from the second end of the resistor 70 or $V_{SS}$ is supplied to the second region 34. This would cause approximately $V_{SS}$ or ground voltage to be supplied to the gate 58 of the NMOS transistor 51, which would turn it off. This would disconnect the source 12 from the circuit 14. At the same time, with $V_{SS}$ or ground supplied to the second region 34, this voltage is also supplied to the gate 58 of the NMOS FET transistor 60. This would turn off the NMOS FET transistor 60 thereby disconnecting the well 49 from the source of voltage supplied at the first region 62.

As can be seen from the foregoing, when the gate 58 of the NMOS transistor 51 is supplied with a voltage that turns it on, the well 49 in which the NMOS transistor 51 is constructed can be supplied with a voltage that is supplied to the first region 62 of the NMOS transistor 60. This would alter the dynamic threshold of the NMOS FET transistor 51. In changing the voltage threshold of the NMOS transistor 51, the switching speed of the NMOS transistor 51 can be increased. When the voltage supplied to the gate 58 of the NMOS transistor 51 is $V_{SS}$ or ground thereby disconnecting the source 12 from the circuit 14, that same voltage turns off the NMOS transistor 60. The voltage supplied to the well 49 is the native threshold voltage to which the well has been implanted. Thus, in the operation of the reprogrammable non-volatile switch 20 of the present invention, the speed with which the NMOS transistor 51 can switch can be greatly increased.

Alternatively, the NMOS FET 60 can be replaced by a PMOS FET 60. In that event, when the NMOS switching transistor 51 is turned on, the PMOS FET 60 would be turned off, and vice versa. Thus, for example, the well 49 may be doped so that the V threshold is very low. In "normal" operation, when the switching transistor 51 is off, the PMOS FET 60 connects the well 49 to a source of voltage such as a negative voltage, keeping the NMOS switching transistor 51 turned off. However, when the NMOS switching transistor 51 is turned on, the PMOS FET 60 is disconnected from the source of voltage supplied to region 62. Another alternative would be where the NMOS switching transistor 51 is of P type and the NMOS FET 60 is of N type. These alternative embodiments also apply to the embodiments shown and described in FIG. 4B-4H.

Referring to FIG. 4B, there is shown a second embodiment of the reprogrammable non-volatile switch 20 of the present invention. The embodiment shown in FIG. 4B is identical to the embodiment shown in FIG. 4A except that the second end of the resistor 70 is connected to Vdd or a source of positive voltage, such as +3.3 volts. The mechanism of programming electrons onto the floating gate 40 through the tunneling insulating layer 56 from either the substrate 30 or from either of the regions 50 or 52 is identical to the programming mechanism described for the embodiment shown in FIG. 4A. Similarly, the erase mechanism for removal of the electrons from the floating gate 40 is identical to the mechanism described for the embodiment shown in FIG. 4A.

In the operation of the reprogrammable non-volatile switch 20 shown in FIG. 4B, an operating voltage such as $V_{SS}$ or ground is supplied to the first region 32 of the cell 35. A positive voltage such as +2 volts is supplied to the control gate 44. If the floating gate 40 is erased, then it is positively charged. This would cause the voltage supplied to the first region 32 to be passed through the channel 36 onto the second region 34. With $V_{SS}$ supplied to the gate 58 of the NMOS transistor 51, the source 12 is disconnected from the circuit 14. In addition, the NMOS FET 60 is also turned off. If the floating gate 40 were programmed, then electrons on the floating gate 40 would prevent the voltage applied to the first region 32 to pass through the channel 36 and to the second region 34. However, the voltage from the second end of the resistor 70 would be supplied to the second region 34. This would turn on the MOS transistor 51 connecting the source 12 to the circuit 14. In addition, this would turn on the NMOS FET 60, thereby connecting the well 49 to the voltage supplied at the first region 34.

Referring to FIG. 4C, there is shown another embodiment of the reprogrammable non-volatile switch 20 of the present invention. The embodiment shown in FIG. 4C is identical to the embodiment shown in FIG. 4A except for the replacement of the polysilicon resistor 70 by a PMOS FET 71 connecting the second region 34 of the cell 35 to ground. The mechanism for programming is identical to the mechanism described for the embodiment shown and described in FIG. 4B. The mechanism of erase is identical to the mechanism of erase described for the embodiment shown and described in FIGS. 4A and 4B. Finally, in the operation of the switch 20 shown FIG. 4C, an operating voltage such as +3.3 volts is supplied to the first region 32 of the cell 35. A positive voltage, such as +2 volts, is supplied to the control gate 44. If the floating gate 40 is erased, then the voltage +3.3 volts supplied to the first region 32 passes through the channel 36 onto the second region 34. Thus, +3.3 volts appears at the second region 34 where it is applied to the gate 58 of the MOS transistor 51 and 60. This would turn on both of these transistors. In addition, if the floating gate 40 is erased, then the positive voltage of the floating gate 40 is applied to the gate of the PMOS transistor 71 thereby turning of the PMOS transistor 71. However, if the floating gate 40 of the cell 35 is programmed, then the electrons on the floating gate 40 would inhibit the flow of current in the channel 36 between the first region 32 and the second region 34 of the cell 35. In addition, the negative voltage on the floating gate 40 would turn on the PMOS transistor 71 thereby connecting the second region 34 of the cell 35 to ground. The ground voltage would then be applied to the gate 58 of the NMOS transistors 51 and 60 thereby turning off those transistors.

Referring to FIG. 4D, there is shown another embodiment of the reprogrammable non-volatile switch 20 of the present invention. The embodiment shown in FIG. 4D is identical to the embodiment shown in FIG. 4C except the PMOS FET 71 is connected to VDD or a positive voltage, such as +3.3 volts. The mechanism for programming is identical to that described for the embodiment shown in FIGS. 4B–4C. The mechanism of erase is identical to the mechanism of erase described for the embodiment shown and described in FIGS. 4A–4C. Finally, the operation of the switch 20 shown FIG. 4D is also identical to the operation of the switch 20 shown and described in FIG. 4B, except that a ground or $V_{SS}$ voltage is applied to the first region 32. When the floating gate 40 is erased, it turns off the PMOS FET 71, but $V_{SS}$ is supplied to the gate 58 of the NMOS transistors 51 and 60, which turns off these transistors. When the floating gate 40 is programmed, it inhibits the voltage supplied to the first region 32 from being supplied to the second region 34. In addition, the negatively charged floating gate 40 turns on the PMOS FET 71, providing a source of positive voltage to the gate 58, turning on the transistors 51 and 60.

Referring to FIGS. 4E–4H, there is shown four other embodiments of the reprogrammable non-volatile switch 20 of the present invention. Each of the embodiments shown in FIGS. 4E–4H is identical to the corresponding embodiment shown in FIGS. 4A–4D except the gate 58 of the FET transistor 60 is connected directly to the floating gate 40 of the cell 35. The mechanisms of programming, erasing and operating of the reprogrammable non-volatile switch 20 for each of the embodiments 4E–4H is identical to the corresponding embodiment shown in FIGS. 4A–4D. Thus, as an example, in the embodiment shown in FIG. 4E, the mechanism of programming is identical to the mechanism described for the embodiment shown in FIG. 4A. Electrons can be programmed through the polysilicon resistor 70 or through the tunneling insulating region 58 in the MOS transistor 51 (through either the substrate 30 or from the first and second regions 50 and 52) and be hot channel injected onto the floating gate 40 of the memory cell 35. The mechanism of erase is through the tunneling of the electrons from the floating gate 40 onto the control gate 44 within the memory cell 45. In operation, if the floating gate 40 were erased, it would be positively charged, thereby permitted a positive voltage such as +3.3 volts applied to the first region 32 to be passed through to the second region 34 and be applied to the gate 58 of the MOS transistor 51. In addition, with the floating gate 40 erased, the positive charge on the floating gate 40 is applied to the gate 58 of the NMOS transistor 60 thereby turning on the NMOS transistor 60. This connects the well 49 to a source of voltage for changing the threshold of the MOS transistor 51. If the floating gate 40 were programmed, the floating gate 40 would be negatively charged. This would turn off the NMOS FET 60. In addition, it would inhibit the voltage supplied at the first region 32 from being passed through the channel 36 to the second region 34. The ground voltage from the second end of the polysilicon resistor 70 would then be supplied to the second region 34, and turn off the MOS switching transistor 51. Similarly, the mechanisms of erasing, programming and operating for the embodiment shown in FIG. 4F is identical to the embodiment shown in FIG. 4B, FIG. 4G to 4C, and FIG. 4H to 4D.

Referring to FIG. 5A, there is shown another embodiment of the reprogrammable non-volatile switch 20 of the present invention. The switch 20 comprises a non-volatile memory cell 35 all as shown as previously described. However, the first and second regions 32 and 34 are of the P conductivity type. Thus, the charges that traverse through the channel 36 of the cell 35 are "holes" rather than electrons. In addition, the MOS transistor 51 is also of P conductivity type. Thus the first and second regions 50 and 52 of the MOS transistor 51 are also of P conductivity type. Finally, the FET 60 is of P conductivity type. Thus, the first and second regions 62 and 64 of the PMOS FET 60 are of P conductivity type. The cell 35, the MOS transistor 51 and the FET 60 are all connected in the same arrangement as shown and described for the embodiment shown in FIG. 4A. The second region 64 of the PMOS FET 60 is connected to the well 49. One end of the polysilicon resistor 70 is connected to $V_{SS}$ or ground.

In the operation of the reprogrammable non-volatile switch 20 of the embodiment shown in FIG. 5A, the first and second regions 50 and 52 of the PMOS transistor 51 is connected to ground or $V_{SS}$. The first region 32 of the cell 35 is connected to a source of negative voltage such as −12 volts. A low negative voltage, such as −2 volts is supplied to the control gate 44. Holes from the first and second regions 50 and 52 of the MOS transistor 51 (or from the substrate 30, if the substrate 30 is connected to $V_{SS}$ or ground), tunnel through the tunneling insulating layer 56 onto the second region 34 of the cell 35 and traverse into channel 36 and are attracted to the first region 32. They accelerate and are injected onto the floating gate 40. Finally, similar to the embodiment shown and described in FIG. 4A, the source for the holes can be from $V_{SS}$ or the source of voltage to which the polysilicon resistor 70 is attached. To erase the cell 35, the control gate 44 is connected to a source of negative voltage and electrons from the control gate 44 tunnel through the second insulating layer 42 onto the floating gate 40 to "neutralize" the holes.

In operation, a positive voltage such as Vdd or +3.3 volts is supplied to the first region 32. If the floating gate 40 were positively charged, i.e., with holes injected through the first insulating layer 38 onto the floating gate 40, then since this is P type device, the voltage at the first region 32 would not pass through the channel 36 onto the second region 34. In that event, $V_{SS}$ from the end of polysilicon resistor 70 is supplied to the second region 34 of the cell 35. Since this is a ground voltage and since transistors 60 and 51 are PMOS type, they are turned on. If the cell 35 were erased, then the negative charges on the floating gate 40 would turn on the channel 36. The positive voltage supplied to the first region 32 would pass through the channel 36 and be present at the second region 34. The positive voltage is then supplied to the gate 58 of the PMOS transistors 51 and 60, thereby turning them off and disconnecting the source 12 from the circuit 14.

Furthermore, similar to the embodiment shown and described in FIG. 4A, the MOS switching transistor 51 can be N type, with the MOS FET 60 being P type, or the MOS switching transistor 51 being P type with MOS FET 60 being N type, or both of the transistors 51 and 60 being N type. These alternative embodiments also apply to the embodiments shown and described in FIG. 5B-5H.

Referring to FIG. 5B, there is shown another embodiment of the reprogrammable non-volatile switch 20 of the present invention. The embodiment shown in FIG. 5B is identical to the embodiment shown in FIG. 5A except the end of the polysilicon resistor 70 is connected to a source of positive voltage such as $V_{DD}$ or +3.3 volts. The mechanism of programming is identical to the mechanism of programming for the embodiment shown in FIG. 5A in that holes are tunneled through the tunneling insulating layer 56 onto the gate 58 through either the substrate 30 or through the first and second regions 50 and 52 of the MOS transistor 51. From the gate 58, the holes traverse to the second region 34 where they are accelerated and injected onto the floating gate 40. The mechanism of erasure is the same as the mechanism shown and as described from the embodiment shown in FIG. 5A in that electrons from the control gate 44 tunnel through the second insulating layer 42 of the cell 35 and onto the floating gate 40 to "neutralize" the holes therein.

In the operation of the reprogrammable non-volatile switch 20 of the embodiment shown in FIG. 5B, a low positive voltage or ground such as $V_{SS}$ is applied to the first region 32. If the floating gate 40 were positively charged, the channel 36 would be turned off. Thus, the low positive voltage or ground would not be passed to the second region 34. The voltage source $V_{DD}$ to which the polysilicon resistor 70 is attached would then be supplied to the second region 34 where it is applied to the gate of the MOS transistor 60 and 51. Since this voltage is positive, it would turn off both of these transistors. If the floating gate 40 were erased, it would be negatively charged. In that event, $V_{SS}$ or ground from the first region 32 would be passed through the channel 36 onto the second region 34. This voltage is supplied to the gate of the PMOS transistors 60 and 51 turning on both of those transistors.

The embodiments of the reprogrammable non-volatile switch 20 shown in FIGS. 5C–5H are symmetrical with respect to the embodiment shown in FIGS. 4C–4H. Each of the MOS transistors 60 and 51 shown as N-type in FIGS. 4C–4H are replaced by P-type. In addition, the PMOS transistor 71 shown in FIGS. 5C, 5D, 5G and 5H is replaced by an NMOS transistor. In all other aspects, the operation of the reprogrammable non-volatile switch 20 shown in FIGS. 5C–5H are identical to the operation shown in FIGS. 5A–5B.

From the foregoing, it can be seen that the principles of operation for the switch 20 shown in the embodiments in FIGS. 5A–5H are the same as that for the switch 20 shown in FIGS. 4A–4H except that charges for the electrons are replaced by holes. In the present invention, the threshold voltage of the well 49, in which the switching transistor 51 is constructed, can be changed, thereby increasing the switching speed of the switching transistor 51. However, this advantage in speed requires the switching transistor 51 to be placed in a well 49, which takes up real estate. Further, even when the switching transistor 51 is "off", the voltage of the well 49 can be "leaky" causing leakage in current.

What is claimed is:

1. An integrated circuit comprising:
   a well;
   a source for a signal;
   a circuit;
   a switching transistor, in said well, for selectively connecting said source to said circuit, said switching transistor having a first terminal and a spaced apart second terminal with a channel therebetween, a tunneling insulating layer on said channel, and a gate on said tunneling insulating layer for controlling the flow of current between said first terminal and said second terminal; said first terminal is connected to said source, and said second terminal is connected to said circuit;
   a non-volatile memory cell having a first region and a spaced apart second region with a channel therebetween, said first and said second regions being of a first conductivity type with said channel being of a second conductivity type; a first insulating layer over said channel; a floating gate on said first insulating layer and spaced apart from a first portion of said channel, wherein said first portion of said channel is adjacent to said first region; a control gate on said first insulating layer and spaced apart from a second portion of said channel; wherein said second portion of said channel is adjacent to said second region; and a second insulating layer between said floating gate and said control gate; wherein said first insulating layer permits the injection of charges from said channel onto said floating gate, and said second insulating layer permits the Fowler-Nordheim tunneling of electrons between said floating gate and said control gate;

said gate of said switching transistor connected to said second region of said non-volatile memory cell;

an FET transistor having a first terminal and a spaced apart second terminal, with a channel therebetween, and a gate controlling the flow of current between said first terminal and said second terminal; said gate of said FET transistor connected to said non-volatile memory cell, said first terminal connected to a first voltage, and said second terminal connected to said well;

a circuit element connecting said second region of said non-volatile memory cell to a second voltage;

wherein said switching transistor is connectable to a third voltage, said control gate is connectable to a fourth voltage, and said first region is connectable to a fifth voltage permitting charges to tunnel through said tunneling insulating layer of said switching transistor to said second region, into said channel of said non-volatile memory cell, and being injected onto said floating gate for programming;

wherein said control gate is connectable to a sixth voltage for removal of charges from said floating gate;

wherein said first region is connectable to a seventh voltage to control the connection of said source to said circuit depending upon the state of said floating gate; and wherein said voltage of said well can be altered by the state of the non-volatile memory cell.

2. The integrated circuit of claim 1 wherein said charges are holes.

3. The integrated circuit of claim 1 wherein said charges are electrons.

4. The integrated circuit of claim 3 wherein said source for a signal is a voltage source.

5. The integrated circuit of claim 3 wherein said source for a signal is a first circuit, and wherein said circuit is a second circuit.

6. The integrated circuit of claim 5 wherein said first circuit is a first logic circuit, and wherein said second circuit is a second logic circuit.

7. The integrated circuit of claim 5 wherein said integrated circuit is a FPGA.

8. The integrated circuit of claim 3 wherein said first voltage is ground.

9. The integrated circuit of claim 8 wherein said first and second terminals of said switching transistor are connected to ground.

10. The integrated circuit of claim 8 wherein said switching transistor has a substrate and wherein said substrate is connected to ground.

11. The integrated circuit of claim 3 wherein said first region of said non-volatile memory cell is capacitively coupled to said floating gate, and wherein said fifth voltage is a positive voltage sufficient to cause said electrons in said channel of said non-volatile memory cell to be injected onto said floating gate.

12. The integrated circuit of claim 1 wherein said first conductivity type is P type and said second conductivity type is N type.

13. The integrated circuit of claim 1 wherein said first conductivity type is N type and said second conductivity type is P type.

14. The integrated circuit of claim 13 wherein said switching transistor is a NMOS transistor.

15. The integrated circuit of claim 3 wherein said circuit element is a resistor.

16. The integrated circuit of claim 15 wherein said resistor is a polysilicon resistor.

17. The integrated circuit of claim 3 wherein said circuit element is an FET transistor.

18. The integrated circuit of claim 17 wherein said FET transistor is a NMOS FET.

19. The integrated circuit of claim 17 wherein said FET transistor is a PMOS FET.

20. The integrated circuit of claim 3 wherein said gate of said FET transistor is connected to said second region of said non-volatile memory cell.

21. The integrated circuit of claim 3 wherein said gate of said FET transistor is connected to said floating gate of said non-volatile memory cell.

22. A method of operating an integrated circuit, having a source for a signal and a circuit, and a switching transistor for connecting said source to said circuit, with said switching transistor, in a well, for selectively connecting said source to said circuit, said switching transistor having a first terminal and a spaced apart second terminal with a channel therebetween, a tunneling insulating layer on said channel, and a gate on said tunneling insulating layer for controlling the flow of current between said first terminal and said second terminal; said first terminal is connected to said source, and said second terminal is connected to said circuit; a non-volatile memory cell, having a first and a second state, and being connected to said gate of said switching transistor; an FET transistor having a first terminal and a spaced apart second terminal, with a channel therebetween, and a gate for controlling the flow of current between said first terminal and said second terminal; said gate of said FET transistor connected to said non-volatile memory cell, said first terminal connected to a first voltage, and said second terminal connected to said well; and a circuit element connecting said second region of said non-volatile memory cell to a second voltage; wherein said method comprising:

placing said non-volatile memory cell in said first state or said second state; and controlling a voltage applied to said well based upon said first or second state of said non-volatile memory cell.

23. An integrated circuit comprising:

a well;

a source for a signal;

a circuit;

a switching transistor, in said well, for selectively connecting said source to said circuit, said switching transistor having a first terminal and a spaced apart second terminal with a channel therebetween, and a gate for controlling the flow of current between said first terminal and said second terminal; said first terminal is connected to said source, and said second terminal is connected to said circuit;

a non-volatile memory cell having a first region and a spaced apart second region with a channel therebetween, said first and said second regions being of a first conductivity type with said channel being of a second conductivity type; a first insulating layer over said channel; a floating gate on said first insulating layer and spaced apart from a first portion of said channel, wherein said first portion of said channel is adjacent to said first region; a control gate on said first insulating layer and spaced apart from a second portion of said channel; wherein said second portion of said channel is adjacent to said second region; and a second insulating layer between said floating gate and said control gate; wherein said first insulating layer permits the injection of charges from said channel onto said floating gate, and said second insulating layer permits the Fowler-Nordheim tunneling of electrons between said floating gate and said control gate;

said gate of said switching transistor connected to said second region of said non-volatile memory cell;

an FET transistor having a first terminal and a spaced apart second terminal, with a channel therebetween, and a gate controlling the flow of current between said first terminal and said second terminal; said gate of said FET transistor connected to said non-volatile memory cell, said first terminal connected to a first voltage, and said second terminal connected to said well;

a resistor connecting said second region of said non-volatile memory cell to a second voltage;

wherein said control gate is connectable to a fourth voltage, and said first region is connectable to a fifth voltage permitting charges to move from said second voltage into said channel of said non-volatile memory cell, and being injected onto said floating gate for programming;

wherein said control gate is connectable to a sixth voltage for removal of charges from said floating gate;

wherein said first region is connectable to a seventh voltage to control the connection of said source to said circuit depending upon the state of said floating gate; and wherein said voltage of said well can be altered by the state of said non-volatile memory cell.

* * * * *